United States Patent
Liu et al.

(10) Patent No.: US 7,892,858 B2
(45) Date of Patent: Feb. 22, 2011

(54) SEMICONDUCTOR PACKAGE WITH STACKED SEMICONDUCTOR DIE EACH HAVING IPD AND METHOD OF REDUCING MUTUAL INDUCTIVE COUPLING BY PROVIDING SELECTABLE VERTICAL AND LATERAL SEPARATION BETWEEN IPD

(75) Inventors: Kai Liu, Phoenix, AZ (US); Robert C. Frye, Piscataway, NJ (US)

(73) Assignee: STATS ChipPAC, Ltd., Singapore (SG)

( * ) Notice: Subject to any disclaimer, the term of this patent is extended or adjusted under 35 U.S.C. 154(b) by 208 days.

(21) Appl. No.: 12/042,903

(22) Filed: Mar. 5, 2008

(65) Prior Publication Data

US 2009/0224361 A1      Sep. 10, 2009

(51) Int. Cl.
*H01L 21/00* (2006.01)
(52) U.S. Cl. .................... 438/3; 438/107; 438/381; 257/E21.001; 257/E23.001
(58) Field of Classification Search ................ 438/3, 438/106, 107, 381; 257/414, E23.001, E21.52, 257/E21.001
See application file for complete search history.

(56) References Cited

U.S. PATENT DOCUMENTS

| | | | |
|---|---|---|---|
| 5,323,060 A | 6/1994 | Fogal et al. | |
| 2003/0100200 A1* | 5/2003 | Franzon et al. | ............... 439/66 |
| 2004/0195591 A1 | 10/2004 | Gehman et al. | |
| 2005/0212084 A1* | 9/2005 | Grange | ........................ 257/537 |
| 2005/0275061 A1* | 12/2005 | Ohguro | ....................... 257/531 |
| 2006/0197642 A1* | 9/2006 | Hargrove et al. | ............ 336/200 |
| 2006/0284698 A1* | 12/2006 | Vaisanen | ....................... 333/26 |
| 2008/0099800 A1* | 5/2008 | Miller et al. | ................. 257/276 |

* cited by examiner

*Primary Examiner*—Matthew S Smith
*Assistant Examiner*—Michele Fan
(74) *Attorney, Agent, or Firm*—Robert D. Atkins; Patent Law Group

(57) ABSTRACT

A semiconductor package has first and second semiconductor die mounted to a substrate. The first semiconductor die includes a first inductor coil electrically coupled to the substrate. The second semiconductor die is mounted over the first semiconductor die. The second semiconductor die includes a second inductor coil electrically coupled to the substrate. A center of the second inductor coil has a vertical and lateral separation with respect to a center of the first inductor coil which are each selectable to minimize mutual inductive coupling between the first and second inductor coils. A spacer is disposed between the first and second semiconductor die to adjust the vertical separation. The center of the second inductor is positioned laterally within the second semiconductor die with respect to the center of the first inductor to adjust the lateral separation. The mutual inductive coupling decreases with increasing vertical and lateral separation.

21 Claims, 6 Drawing Sheets

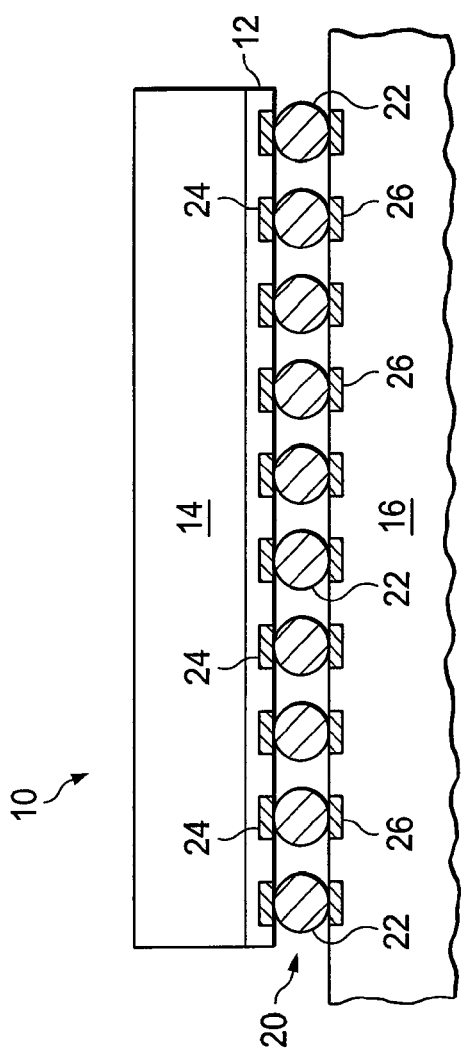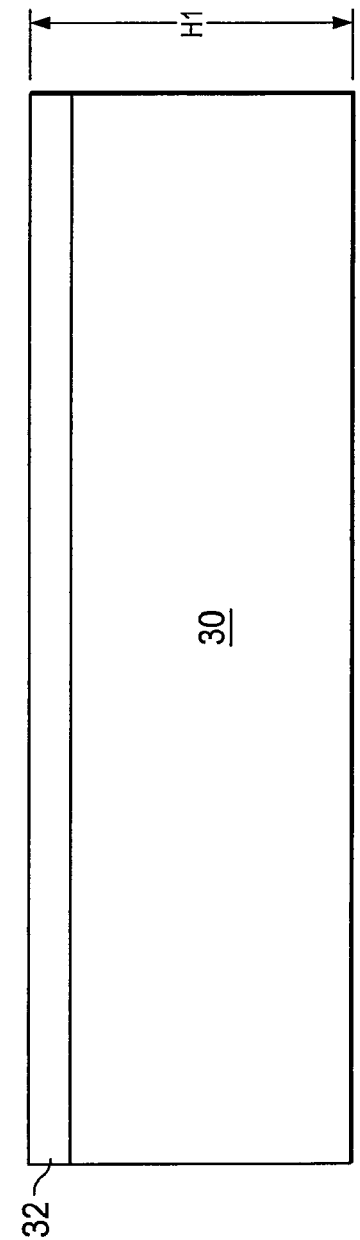

US 7,892,858 B2

SEMICONDUCTOR PACKAGE WITH STACKED SEMICONDUCTOR DIE EACH HAVING IPD AND METHOD OF REDUCING MUTUAL INDUCTIVE COUPLING BY PROVIDING SELECTABLE VERTICAL AND LATERAL SEPARATION BETWEEN IPD

FIELD OF THE INVENTION

The present invention relates in general to semiconductor devices and, more particularly, to a semiconductor package with stacked semiconductor die each having an integrated passive device and method of reducing mutual inductive coupling by providing selectable vertical and lateral separation between the integrated passive devices.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPD) are often contained within the semiconductor device. A typical RF system requires multiple IPDs on multiple semiconductor devices to perform the necessary electrical functions. If placed side-by-side, the semiconductor devices generally exhibit good isolation and RF signal integrity. However, the side-by-side arrangement for the semiconductor devices requires a large foot-print and consumes a large area, which can be problematic when circuit board space is at a premium. If the semiconductor devices are stacked, there is an undesirable mutual inductive coupling or interference between the stacked IPD devices.

A need exists for a semiconductor package containing multiple semiconductor devices, each having an IPD, which minimizes mutual inductive coupling between the IPD while maintaining a small footprint.

SUMMARY OF THE INVENTION

In one embodiment, the present invention is a method of making a semiconductor package comprising the steps of providing a substrate, and mounting a first semiconductor die to the substrate. The first semiconductor die includes a first integrated passive device electrically coupled to the substrate. The method further includes the step of mounting a second semiconductor die over the first semiconductor die. The second semiconductor die includes a second integrated passive device electrically coupled to the substrate. A center of the second integrated passive device has a vertical and lateral separation with respect to a center of the first integrated passive device which are each selectable to minimize mutual inductive coupling between the first and second integrated passive devices.

In another embodiment, the present invention is a method of making a semiconductor package comprising the steps of providing a substrate, and mounting a first semiconductor die to the substrate. The first semiconductor die includes a first inductor coil electrically coupled to the substrate. The method further includes the step of mounting a second semiconductor die over the first semiconductor die. The second semiconductor die includes a second inductor coil electrically coupled to the substrate. A center of the second inductor coil has a vertical or lateral separation with respect to a center of the first inductor coil which is selectable to minimize mutual inductive coupling between the first and second inductor coils.

In another embodiment, the present invention is a method of making a semiconductor package comprising the steps of providing a substrate, and mounting a first semiconductor die to the substrate. The first semiconductor die includes a first inductor coil electrically coupled to the substrate. The method further includes the step of mounting a second semiconductor die over the first semiconductor die. The second semiconductor die includes a second inductor coil electrically coupled to the substrate. The second inductor coil has a vertical and lateral separation with respect to the first inductor coil which are each selectable to minimize mutual inductive coupling between the first and second inductor coils.

In another embodiment, the present invention is a semiconductor device comprising a substrate and a first semiconductor die mounted to the substrate. The first semiconductor die includes a first inductor coil electrically coupled to the substrate. A second semiconductor die is mounted over the first semiconductor die. The second semiconductor die includes a second inductor coil electrically coupled to the substrate. A center of the second inductor coil has a vertical and lateral separation with respect to a center of the first inductor coil which are each selectable to minimize mutual inductive coupling between the first and second inductor coils.

BRIEF DESCRIPTION OF THE DRAWINGS

FIG. 1 is a flip chip semiconductor device with solder bumps providing electrical interconnect between an active area of the die and a chip carrier substrate;

FIG. 2 illustrates a semiconductor substrate with an active surface containing IPDs;

DETAILED DESCRIPTION OF THE DRAWINGS

Figure 3A:
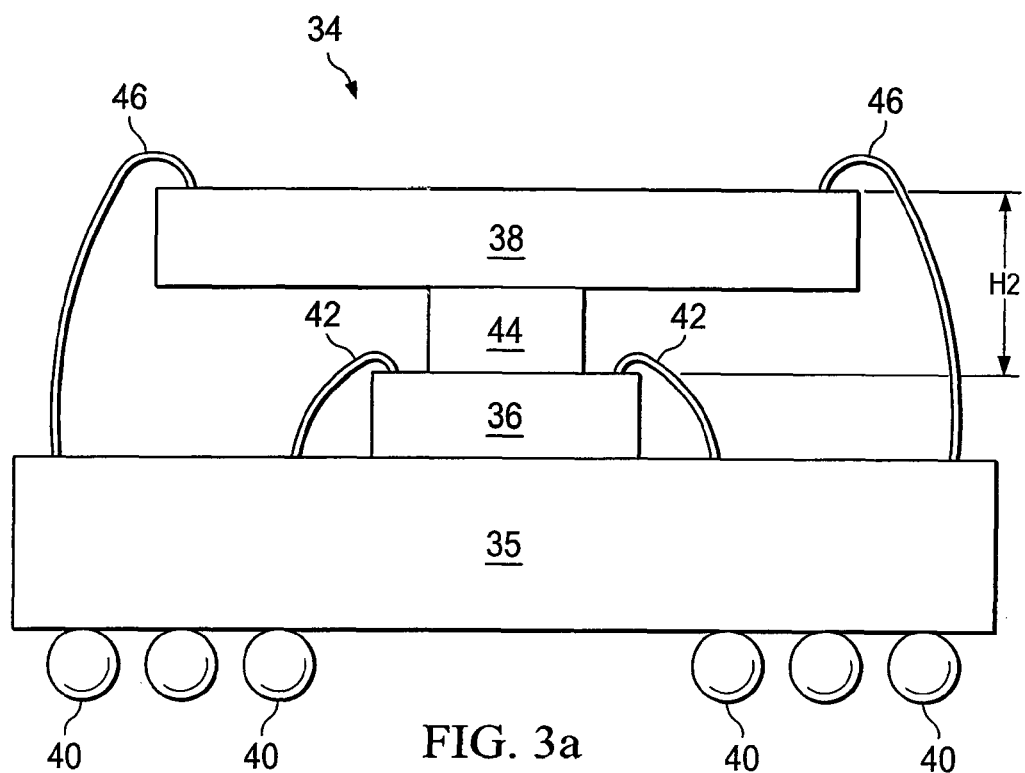
FIGS. 3a-3b illustrate top and cross-sectional views of two stacked semiconductor die each containing IPDs with selectable vertical separation.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Referring to FIG. 2, semiconductor die 28 has a semiconductor substrate 30 which is made of silicon (Si), gallium arsenide (GaAs), glass, or other bulk semiconductor material for structural support. An active region 32 is formed on the top surface of semiconductor substrate 30. Active region 32 includes active devices and integrated passive devices (IPD), conductive layers, and dielectric layers according to the electrical design of the die. The active devices include transistors, diodes, etc. The IPD may include thin film inductors, resistors, and capacitors. Active region 32 occupies about 5-10% of the overall thickness or height H1 of semiconductor die 28. In one embodiment, semiconductor die 28 performs radio frequency (RF) electrical functions, such as wireless transceivers, electronic switches, inductor balun, and low-pass filter.

One application of the semiconductor device with IPDs is front-end wireless RF components, which can be positioned between the antenna and transceiver. These RF components need to meet stringent loss requirements, e.g., in matching balun transformers for power amplifiers, and are considered problematic to integrate into RF integrated circuits (RFIC). Yet, in multi-band transceivers, significant board footprint reduction can be realized by integrating RF components in a common or stacked package within the transceiver.

One concern in stacking the semiconductor die is that the output signal in the transmitter section of the radio frequency integrated circuit (RFIC) may interfere with the local oscillator (LO). The LO includes a voltage-controlled oscillator (VCO) that is synchronized to an external crystal reference through a phase-locked loop (PLL). The LO frequency is usually offset with respect to the transmit and receive frequencies to reduce interference.

The VCO can be implemented as a cross-coupled amplifier circuit with a tuned resonant inductor-capacitor (LC) load. The inductor is made with one or two spiral inductor coils on the RFIC. External signals can couple into the VCO by magnetic induction directly into the tank resonator. If the external source is a periodic or quasi-periodic signal, it will introduce a spurious tone. In subsequent mixing, the RF signal is multiplied by the LO signal to transpose the band of interest down to low frequency for further signal processing. The presence of the spurious tone in the LO often causes out-of-band signals to be mixed into the base-band frequency range, which degrades the receiver sensitivity, adding both noise and crosstalk to the received signal.

A first embodiment of a semiconductor package 34 with stacked semiconductor die 36 and 38 is shown in FIG. 3a. Semiconductor die 36 and 38 each contain one or more IPDs. A multi-layer laminate substrate 35 provides structural support and electrical interconnect for semiconductor die 36 and 38. Substrate 35 includes solder bumps 40 and internal conductive layers for external electrical interconnect. Semiconductor die 36 is mounted to substrate 35 with a die attach adhesive, such as thermal epoxy. Wire bonds 42 electrically connect devices on semiconductor die 36 to substrate 35. A spacer 44 is disposed between semiconductor die 36 and 38. Spacer 44 is made with silicon material. Wire bonds 46 electrically connect devices within semiconductor die 38 to substrate 35.

Semiconductor die 36 and 38 each contain active devices and IPDs. For example, a first inductor coil 50 may be disposed in the active region of semiconductor die 36, while a second inductor coil 52 is disposed in the active region of semiconductor die 38, see FIG. 3b. The inductor coils 50 and 52 can be used in the tank resonators of the LO in a RF transceiver as described above. The inductor coil 50 is a two-turn inductor with ground-signal-ground probe pads 51 electrically connected to substrate 35. The inductor coil 52 is a one-turn inductor with ground-signal-ground probe pads 53 electrically connected to substrate 35. Each semiconductor die dedicates a specific amount space for the inductor coil, according to the electrical design. In this case, inductor 50 in die 36 is made larger, e.g., three to four times larger, than inductor 52 in die 38. The outer diameter of inductor 50 is about 600 μm, while the outer diameter of inductor 52 is about 200 μm. The inductor coil 50 is positioned directly under inductor coil 52, separated by a distance H2 as shown in FIG. 3a.

Figure 4:
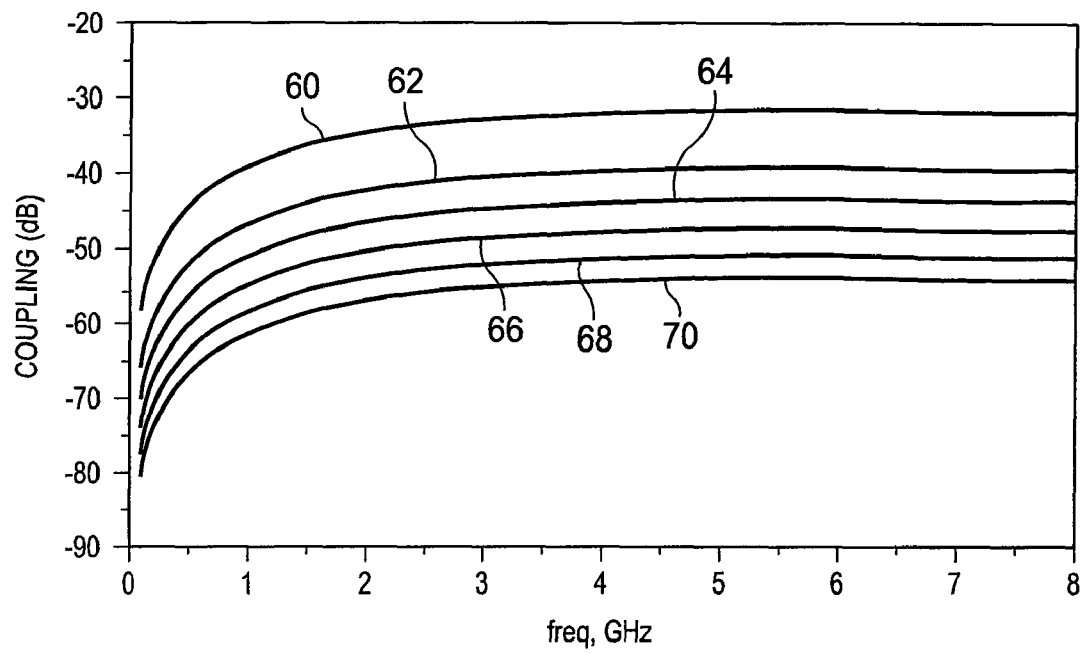
FIG. 4 is a graph of mutual coupling versus frequency for the semiconductor die of FIGS. 3a-3b.

FIG. 4 illustrates a graph of mutual inductive coupling strength versus frequency for inductor coils 50 and 52 as the vertical distance H2 changes. Plot 60 is H2=250 μm; plot 62 is H2=400 μm; plot 64 is H2=500 μm; plot 66 is H2=600 μm; plot 68 is H2=700 μm; plot 64 is H2=800 μm. The case of H2=250 μm represents no spacer 44. The distance increases with the thickness of spacer 44. Each additional 100 μm in spacer thickness provides another 4-5 dB of isolation. Notice that with a larger vertical distance H2, there is less mutual inductive coupling between the inductors, and a higher isolation is exhibited.

Figure 3B:
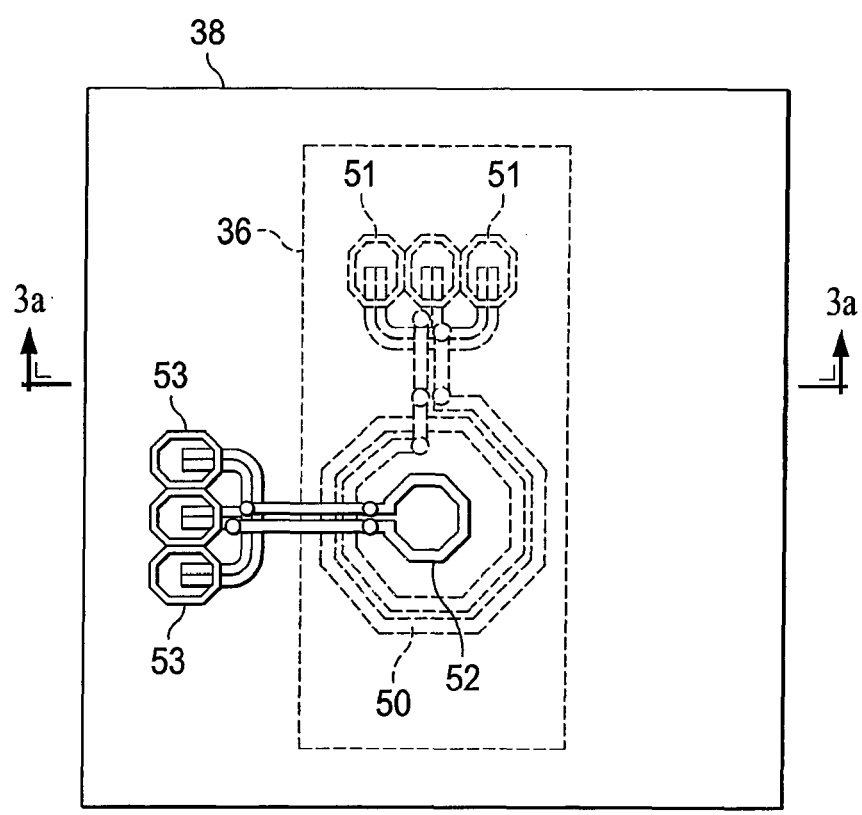

Accordingly, in FIGS. 3a-3b, the vertical separation H2 in the z-axis between the semiconductor die 36 and 38 is selectable by adjusting the thickness of spacer 44 in accordance with the graph of FIG. 4 to achieve the desired mutual inductive coupling. Since the semiconductor die 36 and 38 are vertically stacked, the semiconductor package 34 maintains a small footprint.

Figure 5A:
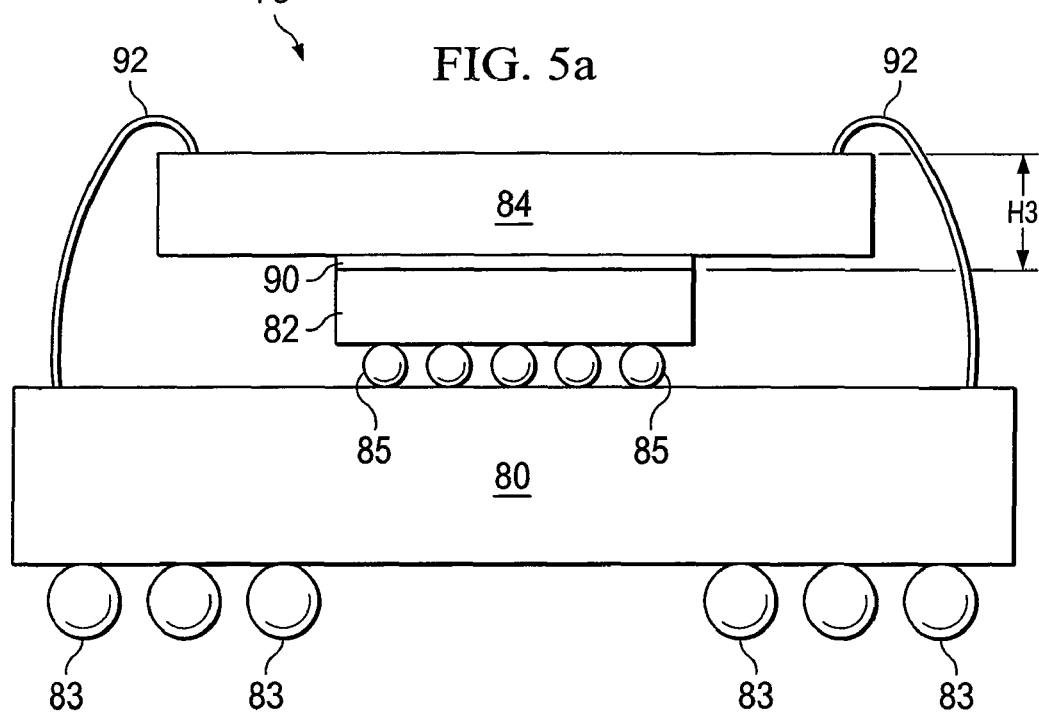
FIGS. 5a-5b illustrate top and cross-sectional views of two stacked semiconductor die each containing IPDs with selectable vertical and lateral separation.

A second embodiment of a semiconductor package 78 with stacked semiconductor die 82 and 84 is shown in FIG. 5a. Semiconductor die 82 and 84 each contain one or more IPDs. A multi-layer laminate substrate 80 provides structural support and electrical interconnect for semiconductor die 82 and 84. Substrate 80 includes solder bumps 83 and internal conductive layers for external electrical interconnect. Semiconductor die 82 is metallurgically and electrically connected to substrate 80 with solder bumps 85. A spacer 90 is disposed between semiconductor die 82 and 84 using an adhesive, such as thermal epoxy. Spacer 90 is made with silicon material. Wire bonds 92 electrically connect IPD devices on semiconductor die 84 to substrate 80.

Figure 5B:
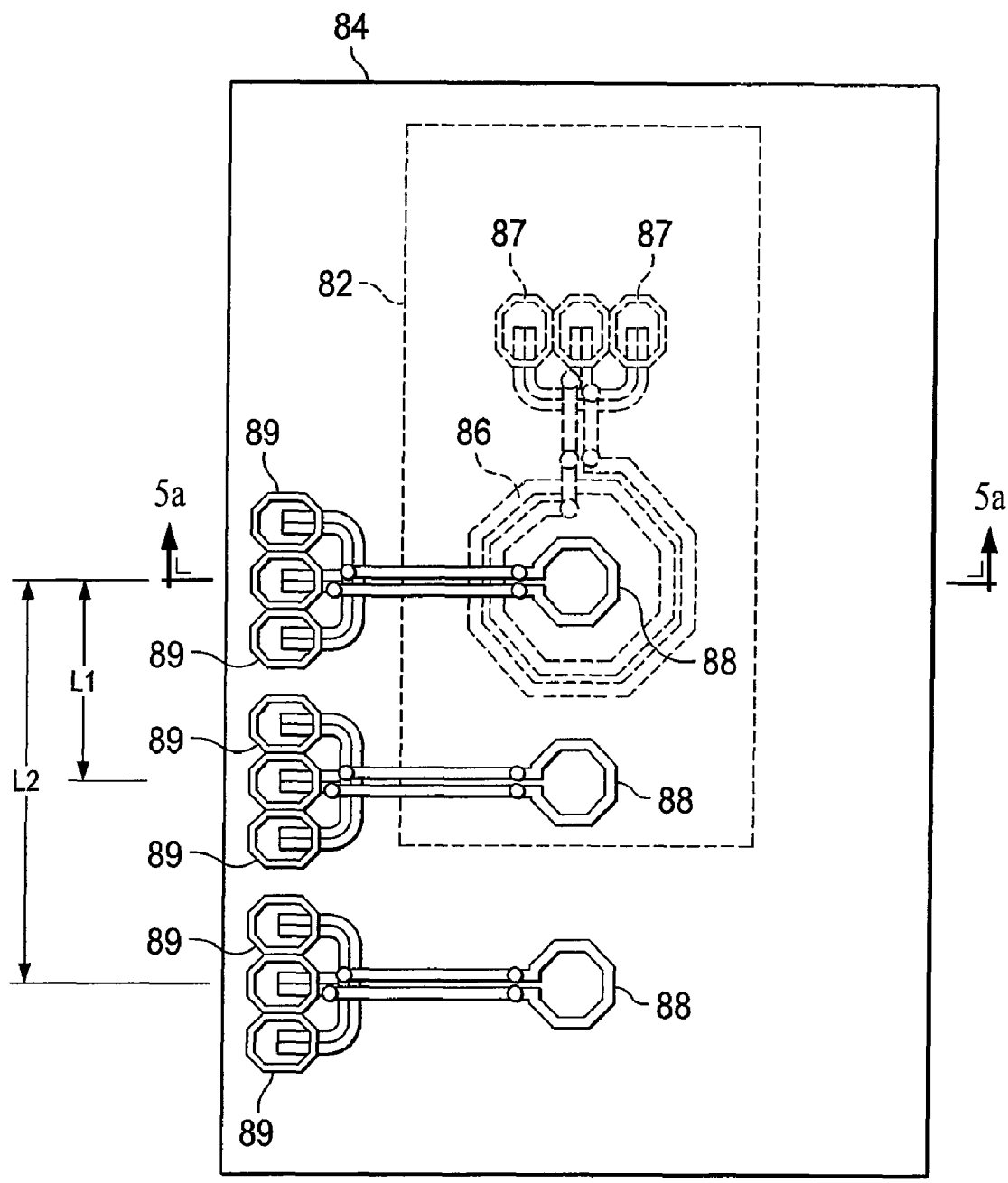

Semiconductor die 82 and 84 each contain active devices and IPDs. For example, a first inductor coil 86 may be disposed in the active region of semiconductor die 82, while a second inductor coil 88 is disposed in the active region of semiconductor die 84. FIG. 5b shows three potential lateral positions for placement of inductor coil 88. Although typically only one inductor coil 88 is disposed at one selectable location in the final design, it is possible to place more than one inductor coil like 88 in semiconductor die 84. The inductor coils 86 and 88 can be used in the tank resonators of the LO in a RF transceiver as described above. The inductor coil 86 is a two-turn inductor with ground-signal-ground probe pads 87 electrically connected to substrate 80. The inductor coil 88 is a one-turn inductor with ground-signal-ground probe pads 89 electrically connected to substrate 80. Each semiconductor die dedicates a specific amount of space for the inductor coil, according to the electrical design. In this case, inductor 86 in die 82 is made larger, e.g., three to four times larger, than inductor 88 in die 84. The outer diameter of inductor 86 is about 600 μm, while the outer diameter of inductor 88 is about 200 μm. The inductor coil 86 is positioned at a vertical distance H3 from inductor 88. Spacer 90 is optional. If no spacer 90 is used, the vertical separation is the thickness of semiconductor die 84, e.g., about 250 μm.

Figure 6:
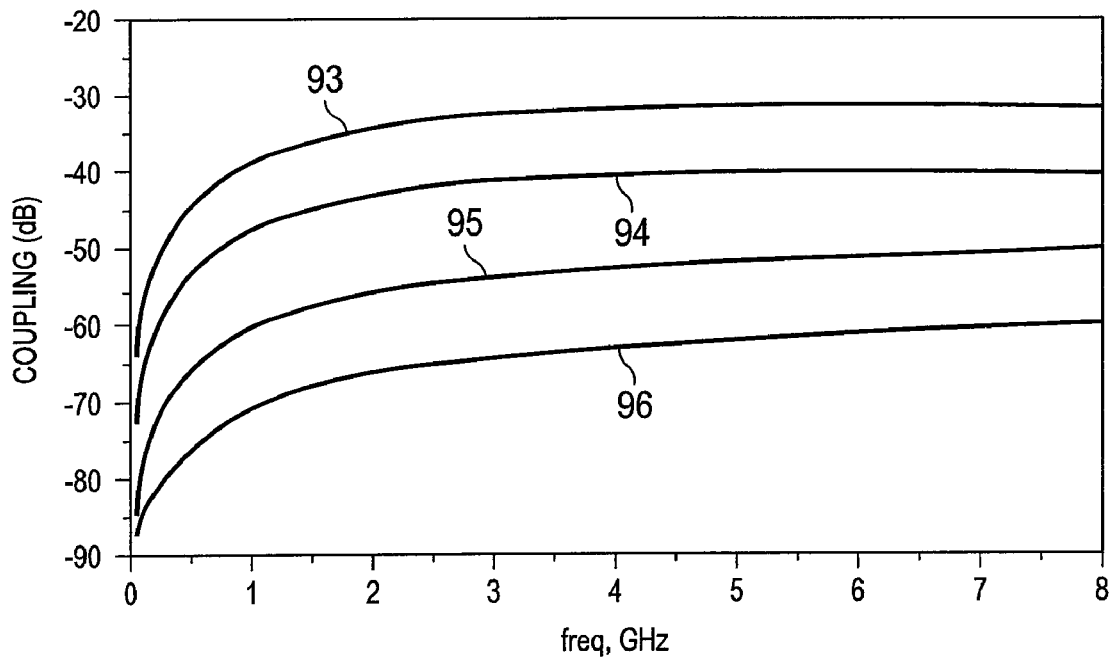
FIG. 6 is a graph of mutual coupling versus frequency for the semiconductor die of FIGS. 5a-5b with no vertical spacer.

FIG. 6 illustrates a graph of mutual inductive coupling strength versus frequency as the lateral distance L is selectable for inductor coils 86 and 88. The selectable vertical separation H3 is 250 μm, with no spacer 90 and 250 μm for semiconductor die 84. Plot 93 is L=0 μm; plot 94 is L=250 μm; plot 95 is L=500 μm; plot 96 is L=750 μm. The case of L=0 μm represents direct vertical alignment between the centers of the inductor coils 86 and 88. Each additional 250 μm in lateral separation provides another 10 dB of isolation. Notice that with a larger lateral distance L, there is less mutual inductive coupling between the inductors and a higher isolation is exhibited.

Figure 7:
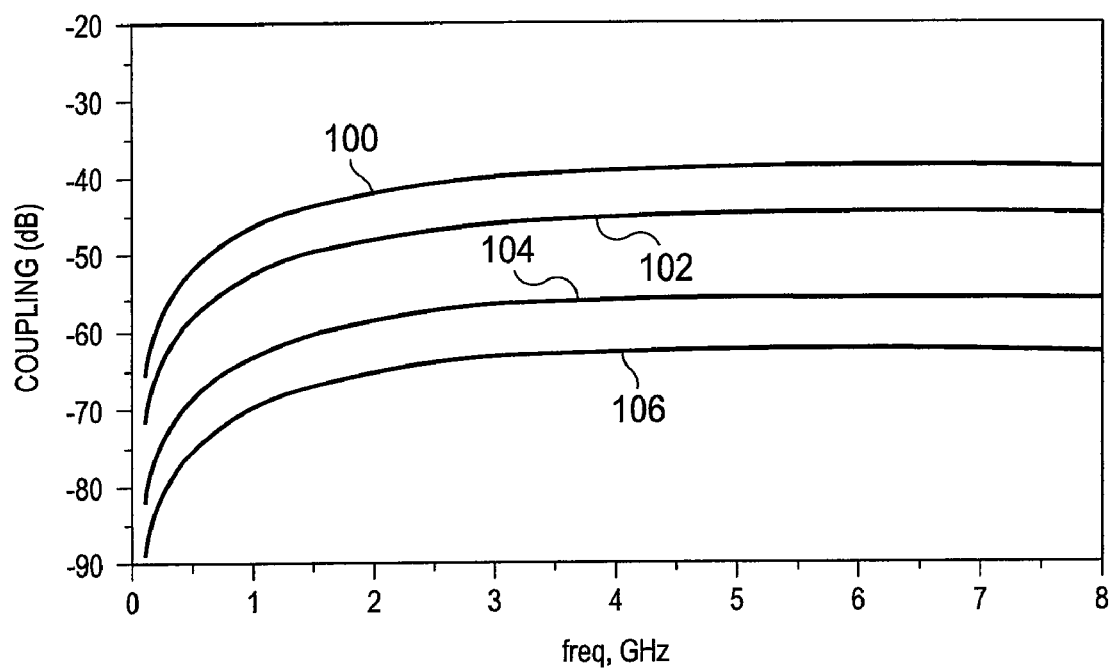
FIG. 7 is a graph of mutual coupling versus frequency for the semiconductor die of FIGS. 5a-5b with 150 μm vertical spacer.

FIG. 7 illustrates a graph of mutual inductive coupling strength versus frequency as the lateral distance L is selectable for inductor coils 86 and 88. The selectable vertical separation H3 is 400 μm, with a 150 μm spacer 90 and 250 μm for semiconductor die 84. Plot 100 is L=0 μm; plot 102 is L=250 μm; plot 104 is L=500 μm; plot 106 is L=750 μm. The case of L=0 μm represents direct vertical alignment between the centers of the inductor coils 86 and 88. Each additional 250 μm in lateral separation provides another 5-10 dB of isolation. For example, the mutual inductive coupling at 2 GHz is about −60 dB. The larger the lateral distance L, the less mutual inductive coupling between the inductors and higher isolation is exhibited.

Figure 8:
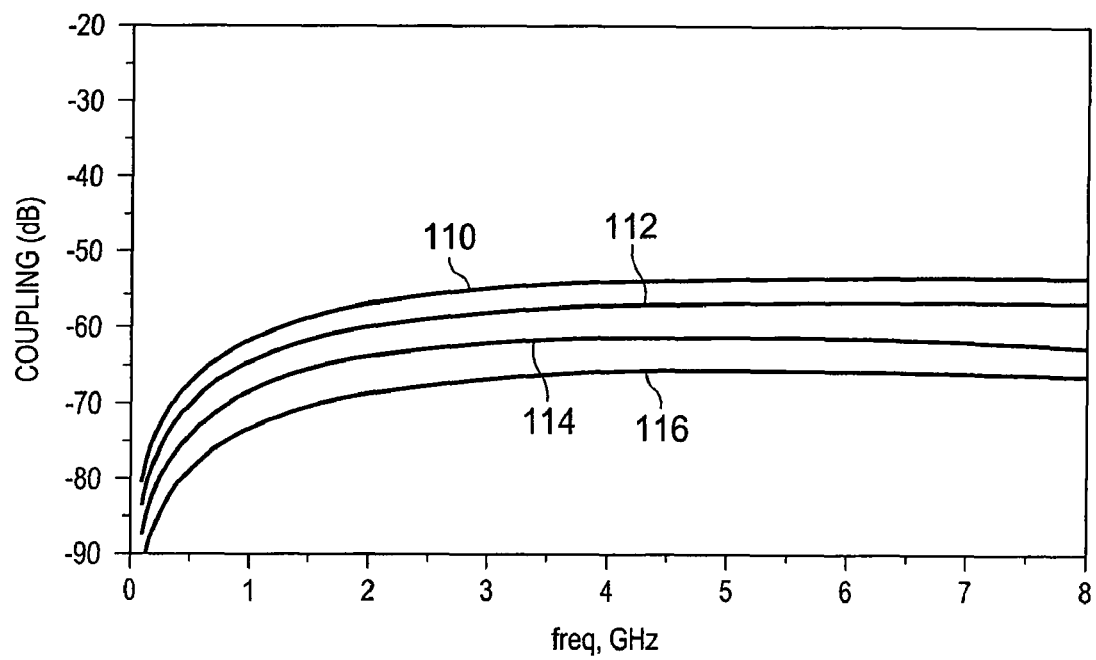
FIG. 8 is a graph of mutual coupling versus frequency for the semiconductor die of FIGS. 5a-5b with 550 μm vertical spacer.

FIG. 8 illustrates a graph of mutual inductive coupling strength versus frequency as the lateral distance L is selectable for inductor coils 86 and 88. The selectable vertical separation H3 is 800 μm, with a 550 μm spacer 90 and 250 μm for semiconductor die 84. Plot 110 is L=0 μm; plot 112 is L=250 μm; plot 114 is L=500 nm; plot 116 is L=750 μm. The case of L=0 μm represents direct vertical alignment between the centers of the inductor coils 86 and 88. Each additional 250 μm in lateral separation provides another 5 dB of isolation. Again, the larger the lateral distance L, the less mutual inductive coupling between the inductors and higher isolation is exhibited.

Accordingly, in FIGS. 5a-5b, the lateral distance L between the centers of the inductor coils 86 and 88, as well as the vertical separation H3 between the semiconductor die 82 and 84, are each selectable to achieve minimal mutual inductive coupling. The lateral distance L is selectable in the x-y axis with the relative placement of the centers of the inductor coils within each die in accordance with the graphs of FIGS. 6-8. The vertical distance H3 is selectable in the z-axis with thickness of spacer 90. Since the semiconductor die 82 and 84 are stacked, the semiconductor package 78 maintains a small footprint.

An important factor in the mutual inductive coupling between the inductor coils is the coupling coefficient. Using a two-port inductance matrix, the S-parameters are first converted to Z-parameters, and then the inductance matrix is defined in equation (1) as:

$$L_{ij} = \text{imag}(Z_{ij})/(2\pi f) \tag{1}$$

The coupling coefficient is then given in equation (2) as:

$$k = L_{12}/\sqrt{L_{11}L_{22}} \tag{2}$$

Figure 9:
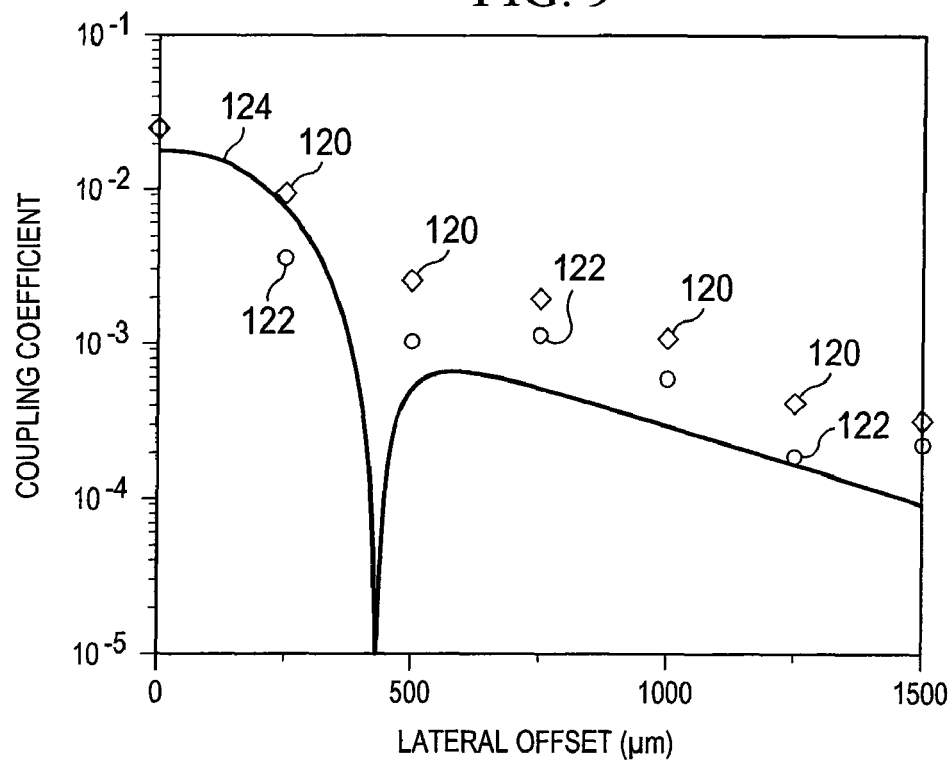
FIG. 9 is a graph of mutual coupling versus lateral offset for the semiconductor die of FIGS. 5a-5b.

At frequencies below the inductor self resonance, the inductance and coupling coefficient are independent of frequency. FIG. 9 shows measured coupling coefficients (data points 120) and simulated coupling coefficients (data points 122) versus lateral offset. Plot 124 represents the coupling coefficients derived analytically. Note that a sign reversal in the coupling coefficients occurs between 250-500 μm in lateral offset. The z-axis component of the magnetic field from a circular loop of current can be calculated analytically, and used to estimate the flux linkage through a smaller loop at a given vertical and lateral offset. The sign reversal at larger lateral offsets corresponds to a null in the coupling. The null occurs at a distance that is comparable to, and somewhat larger than the sum of the radii of the inductor coils. The null corresponds to the separation at which the inductor coils do not overlap.

A coplanar ground shield can be used with the upper stacked die. In a coplanar structure, the regions outside the components and interconnections are filled with a ground plane. Because it is necessary to open holes and provide clearance between the circuits and ground, coplanar ground is less effective than a microstrip structure having a solid ground plane. However, in thin-film technologies the thickness of the dielectrics may not be sufficient to allow use of a ground plane. Consequently, coplanar grounds are more commonly used in such cases, or more commonly the devices are left unshielded. For small values of lateral offset, i.e., in the regions beneath the upper inductor, there is little difference between shielded and unshielded structures. At larger values of lateral offset, the coupling in the shielded structure falls off more steeply. For practical values of offset, the coplanar ground shield reduced the coupling by a factor of 2 to 4.

For two magnetically coupled inductors, the voltage $v_1$ across the LO inductor and voltage $v_2$ across the interfering IPD inductor is given in equations (3) and (4) as:

$$v_1 = j\omega L_{11} i_1 + j\omega L_{12} i_2 \tag{3}$$

$$v_2 = j\omega L_{12} i_1 + j\omega L_{22} i_2 \tag{4}$$

If the magnetic coupling is small, then equations (3) and (4) simplify to:

$$v_1 \approx j\omega L_{11} i_1 + k\sqrt{\frac{L_{11}}{L_{22}}} v_2 \tag{5}$$

$$v_2 \approx j\omega L_{22} i_2 \tag{6}$$

The interference voltage on the LO inductor coil is related to the voltage on the IPD coil by:

$$v_{INT} = k\sqrt{\frac{L_{11}}{L_{22}}} v_{IPD} \tag{7}$$

Accordingly, the height of any spur in the power spectrum is related to the height of the main signal by:

$$PSD_{SPUR}(dBc) = 20 \log_{10}\left[ k\sqrt{\frac{L_{11}}{L_{22}}} \frac{v_{IPD}}{v_{LO}} \right] \tag{8}$$

In most cases, the inductance of the IPD inductor, $L_{22}$, and of the LO inductor, $L_{11}$, are comparable, as are the amplitudes of the voltages $v_1$ and $v_2$. The level of interference from equation (8) simplifies to:

$$PSD_{SPUR}(dBc) \approx 20 \log_{10}(k) \tag{9}$$

The measured characteristics of the stacked semiconductor die demonstrate the general characteristics of mutual inductive coupling and validate the accuracy of electromagnetic simulations for characterizing the levels of interference.

The above graphs and equations have shown that inductive coupling is strongest when the inductor coils are placed directly one atop the other. Similar levels of coupling occur for lateral offsets with any significant overlap of the coils. Accordingly, the IPD should be placed such that no part of the inductor coil overlaps any part of the LO coil on the RFIC. Coplanar ground shields cause the coupling in the far field to fall off more rapidly, roughly with the cube of the distance. The difference in response becomes significant for a lateral offset of 1000 μm or more. In any case, the stacked semiconductor die 28 provides for both selectable vertical and lateral separation between the inductor coils which significantly increases design options while minimizing mutual inductive coupling and reducing footprint area.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor package, comprising:
   providing a substrate;
   mounting a first semiconductor die to the substrate, the first semiconductor die including a first integrated passive device electrically coupled to the substrate;
   mounting a second semiconductor die over the first semiconductor die, the second semiconductor die including a second integrated passive device electrically coupled to the substrate, the second integrated passive device has a smaller area than the first integrated passive device and no portion of the second integrated passive device overlapping the first integrated passive device; and
   disposing a spacer between the first and second semiconductor die to adjust vertical separation;
   wherein a center of the second integrated passive device has vertical and lateral separation with respect to a center of the first integrated passive device which are each selectable to minimize interference between the first and second integrated passive devices.

2. The method of claim 1, wherein the vertical separation is selectable from 250-800 micrometers.

3. The method of claim 1, wherein the center of the second integrated passive device is positioned laterally within the second semiconductor die with respect to the center of the first integrated passive device to adjust the lateral separation.

4. The method of claim 1, wherein the lateral separation is selectable from 0-750 micrometers.

5. The method of claim 1, wherein the first and second integrated passive devices each include an inductor coil.

6. The method of claim 1, wherein the interference decreases with increasing vertical and lateral separation.

7. A method of making a semiconductor package, comprising:
providing a substrate;
mounting a first semiconductor die to the substrate, the first semiconductor die including a first inductor coil electrically coupled to the substrate;
mounting a second semiconductor die over the first semiconductor die, the second semiconductor die including a second inductor coil electrically coupled to the substrate, the second inductor coil has a smaller area than the first inductor coil and no portion of the second inductor coil overlapping the first inductor coil; and
disposing a spacer between the first and second semiconductor die to adjust vertical separation;
wherein a center of the second inductor coil has vertical and lateral separation with respect to a center of the first inductor coil which are each selectable to minimize mutual inductive coupling between the first and second inductor coils.

8. The method of claim 7, wherein the vertical separation is selectable from 250-800 micrometers.

9. The method of claim 7, wherein the center of the second inductor coil is positioned laterally within the second semiconductor die with respect to the center of the first inductor coil to adjust the lateral separation.

10. The method of claim 7, wherein the lateral separation is selectable from 0-750 micrometers.

11. The method of claim 7, wherein the mutual inductive coupling decreases with increasing vertical and lateral separation.

12. A method of making a semiconductor package, comprising:
providing a substrate;
mounting a first semiconductor die to the substrate, the first semiconductor die including a first inductor coil electrically coupled to the substrate;
mounting a second semiconductor die over the first semiconductor die, the second semiconductor die including a second inductor coil electrically coupled to the substrate, wherein no portion of the second inductor coil overlaps the first inductor coil; and
disposing a spacer between the first and second semiconductor die to adjust vertical separation;
wherein the second inductor coil has vertical and lateral separation with respect to the first inductor coil which are each selectable to minimize mutual inductive coupling between the first and second inductor coils.

13. The method of claim 12, wherein the vertical separation is selectable from 250-800 micrometers.

14. The method of claim 12, wherein a center of the second inductor is positioned laterally within the second semiconductor die with respect to a center of the first inductor to adjust the lateral separation.

15. The method of claim 12, wherein the lateral separation is selectable from 0-750 micrometers.

16. The method of claim 12, wherein the mutual inductive coupling decreases with increasing vertical and lateral separation.

17. A semiconductor device, comprising:
a substrate;
a first semiconductor die mounted to the substrate, the first semiconductor die including a first inductor coil electrically coupled to the substrate;
a second semiconductor die mounted over the first semiconductor die, the second semiconductor die including a second inductor coil electrically coupled to the substrate, the second inductor coil having a smaller area than the first inductor coil; and
a spacer disposed between the first and second semiconductor die to adjust vertical separation;
wherein a center of the second inductor coil has vertical and lateral separation with respect to a center of the first inductor coil which are each selectable to minimize mutual inductive coupling between the first and second inductor coils.

18. The semiconductor device of claim 17, wherein the vertical separation is selectable from 250-800 micrometers.

19. The semiconductor device of claim 17, wherein the center of the second inductor is positioned laterally within the second semiconductor die with respect to the center of the first inductor to adjust the lateral separation.

20. The semiconductor device of claim 17, wherein the lateral separation is selectable from 0-750 micrometers.

21. The semiconductor device of claim 17, wherein the mutual inductive coupling decreases with increasing vertical and lateral separation.

* * * * *